United States Patent
Uppal

(10) Patent No.: US 10,012,687 B2
(45) Date of Patent: Jul. 3, 2018

(54) METHODS, APPARATUS AND SYSTEM FOR TDDB TESTING

(71) Applicant: GLOBALFOUNDRIES INC., Grand Cayman (KY)

(72) Inventor: Suresh Uppal, Clifton Park, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 719 days.

(21) Appl. No.: 14/473,937

(22) Filed: Aug. 29, 2014

(65) Prior Publication Data

US 2016/0061880 A1 Mar. 3, 2016

(51) Int. Cl.
| | |
|---|---|
| *G01R 31/12* | (2006.01) |
| *G01R 31/26* | (2014.01) |
| *G01R 31/28* | (2006.01) |
| *G11C 29/50* | (2006.01) |
| *G01R 31/30* | (2006.01) |
| *G11C 11/22* | (2006.01) |
| *G11C 11/401* | (2006.01) |

(52) U.S. Cl.
CPC ......... *G01R 31/12* (2013.01); *G01R 31/1227* (2013.01); *G11C 29/50* (2013.01); *G11C 29/50016* (2013.01); *G01R 31/3004* (2013.01); *G11C 11/22* (2013.01); *G11C 11/401* (2013.01); *G11C 2029/5002* (2013.01)

(58) Field of Classification Search
CPC .... G01R 31/12; G01R 31/1227; G01R 31/26; G01R 31/28; G01R 31/3004; G11C 29/50; G11C 29/50016; G11C 2029/5002; G11C 11/401; G11C 11/22
See application file for complete search history.

(56) References Cited

U.S. PATENT DOCUMENTS

| | | | | |
|---|---|---|---|---|
| 5,883,531 A | * | 3/1999 | Kuo | H03K 19/018585 326/27 |
| 6,351,135 B1 | * | 2/2002 | Kim | G01R 31/1227 324/548 |
| 7,235,998 B1 | * | 6/2007 | Suzuki | G01R 31/129 324/762.09 |
| 9,013,202 B2 | * | 4/2015 | Chen | H01L 22/34 324/537 |
| 9,063,192 B2 | * | 6/2015 | Huang | G11C 16/0425 |
| 2004/0027149 A1 | * | 2/2004 | Aitren | G01R 31/311 324/762.05 |
| 2013/0038334 A1 | * | 2/2013 | Brochu, Jr. | G01R 31/2858 324/537 |

* cited by examiner

*Primary Examiner* — Jermele M Hollington
*Assistant Examiner* — Zannatul Ferdous
(74) *Attorney, Agent, or Firm* — Williams Morgan, P.C.

(57) ABSTRACT

At least one method and system disclosed herein involves performing a time-dependent dielectric breakdown (TDDB) on a plurality of devices. A first device and a second device are provided for testing. A test signal is provided for performing a time-dependent dielectric breakdown (TDDB) test on the first and second devices. A selection signal for selecting said first and second devices for performing said TDDB test. The first and second devices are arranged in series with a first resistor such that based upon said selecting, the test signal is applied substantially simultaneously to the first and second devices through the first resistor. A determination is made as to whether a breakdown and/or a failure of at least one of the first and second devices has occurred based upon a change in voltage across the first resistor.

20 Claims, 9 Drawing Sheets

METHODS, APPARATUS AND SYSTEM FOR TDDB TESTING

BACKGROUND OF THE INVENTION

1. Field of the Invention

Generally, the present disclosure relates to the manufacture of sophisticated semiconductor devices, and, more specifically, to various methods of testing of integrated circuits to determine reliability of the circuits.

2. Description of the Related Art

The fabrication of advanced integrated circuits, such as CPU's, storage devices, ASIC's (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS and as well as metal insulator semiconductor (MIS) technologies are currently among the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors are formed on a substrate including a crystalline semiconductor layer. Generally, MOS technology involves forming a poly/metal gate, as well as dielectric and semiconductor substrates.

Various processes are performed on semiconductor substrates in manufacturing integrated circuit products. When integrated circuits are formed, tests are performed to determine the correctness in the operation of the circuits. Manufacturers generally perform various tests to determine the effects of the various processes on the performance and reliability of the circuits. Various quality or performance criterions may be used in determining whether the integrated circuits meet quality standards.

Dielectric weakening and/or failure with respect to time, temperature, and/or voltage are major concerns with regard to reliability failure of circuits manufactured using current semiconductor technology. In some instances, defects during processing can lead to dielectric failure (e.g., time dependent dielectric breakdown (TDDB) failure mechanism), which may result in a decrease in the overall reliability of the semiconductor devices. Process problems may affect the characteristics of the transistors and/or may cause weakening or failure of dielectric, which may lead to problems such as loss of integrity of the gate of a transistor. Therefore, tests to check various failure mechanisms (e.g., TDDB) are performed for testing the reliability of the integrated circuits.

Manufacturers generally perform tests that help determine the dielectric failure prospects in order to determine the reliability of the circuits. Generally, a primary test that is performed in order to determine the dielectric failure prospects is the TBBD test.

The TDDB test relates to determining when a circuit portion, such as the gate of a MOSFET device, breaks down. This may be caused by weakness in portions of the dielectric. A determination may be made as to when the dielectric part of the circuit portion breaks down at certain particular current-levels, voltage levels, and/or temperature levels. In the example of a MOSFET, the breakdown would keep the gate of the MOSFET from operating properly as a switch that could control the current flow through the source and the drain of the MOSFET.

Accurate lifetime prediction for TDDB requires a large set of samples to be tested under accelerated voltage/temperature stress conditions. One of the problems with the state-of-the-art testing systems is that the number of devices under test (DUTs) at a given time period is limited. For example, the number of DUTs are limited by the number of test pins available on a testing circuit. This causes several problems, such as limitations as to the data available for determining breakdown statistics for a particular accelerated test, delays introduced in testing a large number of devices sequentially, which can change the physics of trapping and de-trapping of charge carriers with respect to breakdown. Moreover, state-of-the-art testing regimen involves determining a so-called beta parameter. When using testing across the wafer to determine beta, the state-of-the-art beta parameter provides indications of global variability, but fail to efficiently capture the local variability at the chip level. Thus, the intrinsic reliability is not efficiently provided by the state-of-the-art testing regimen. This makes the more difficult the task of determining whether one process produced intrinsically superior dielectric from another.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for performing a time-dependent dielectric breakdown (TDDB) tests on a plurality of devices. A first device and a second device are provided for testing. A test signal is provided for performing a time-dependent dielectric breakdown (TDDB) test on the first and second devices. A selection signal for selecting said first and second devices for performing said TDDB test. The first and second devices are arranged in series with a first resistor such that based upon said selecting, the test signal is applied substantially simultaneously to the first and second devices through the first resistor. A determination is made as to whether a breakdown and/or a failure of at least one of the first and second devices has occurred based upon a change in voltage across the first resistor.

BRIEF DESCRIPTION OF THE DRAWINGS

The disclosure may be understood by reference to the following description taken in conjunction with the accompanying drawings, in which like reference numerals identify like elements, and in which.

Figure 1:
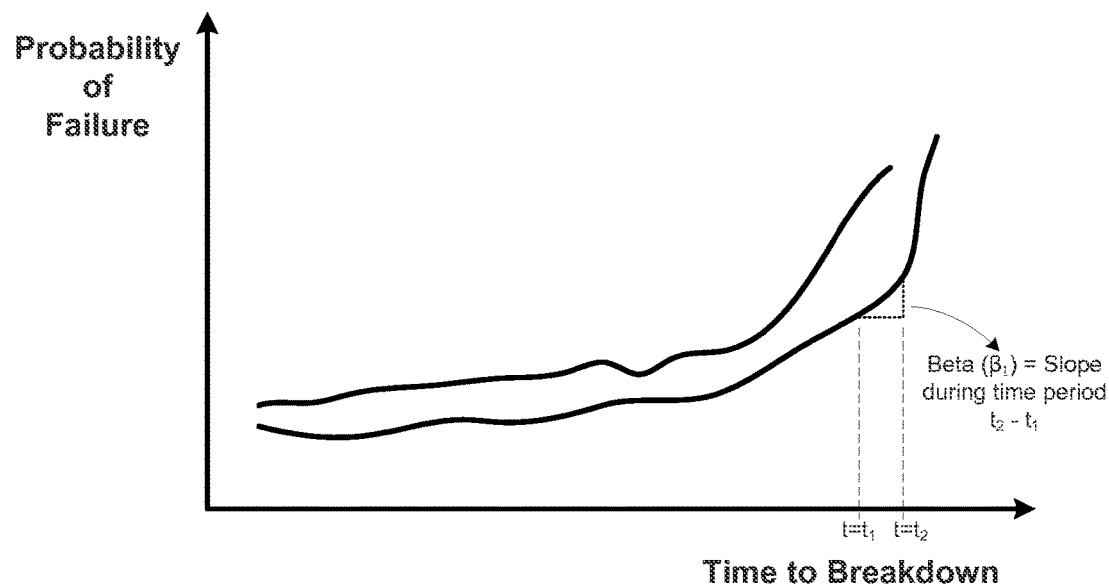
FIG. 1 illustrates a stylized statistical graph of time to breakdown, in accordance with some embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for performing a reliability test upon integrated circuits manufactured by a semiconductor device processing system. The processing output, i.e., the integrated circuits/devices, may be tested for reliability and operational integrity. Embodiments herein provide for an accelerated testing of a plurality of devices. Results of these tests may be used in a learning cycle, which includes analyzing test data, and providing feedback for adjustments in the processing of the integrated circuits, determining a process split between a plurality of process sets, etc. Results of the tests described herein may also provide indication of the intrinsic reliability of devices under test.

In some instances, integrated circuits may contain characteristics that may lead to weakness of the dielectric leading to TDDB failure. Embodiments herein provide for performing a test that would provide data indicative of the TDDB characteristics of a plurality of integrated circuits in a parallel fashion. Therefore, this single testing regimen may be used for determining the transistor characteristics of a plurality of integrated circuits, as well as the gate integrity of transistors, i.e., at which the dielectric becomes weak and fails.

Further, multiple process sets (e.g., a $1^{st}$ process set, a $2^{nd}$ process set, etc.) may provide different sets of integrated circuits/devices. Each process set may comprise a plurality of processing steps, e.g., photolithography process, etch process, CMP process, etc. The integrated circuits manufactured using these process sets may be tested using embodiments herein, performing TDDB tests together on a plurality of devices. Therefore, the learning cycle may also provide for making adjustments to subsequent processes steps within one or more process sets may be accelerated. Using the testing feature exemplified herein, a large number of data points associated with a plurality of devices may be efficiently gathered for more efficient statistical analysis. Based upon information from the TDDB tests provided by embodiments herein, adjustments to parameters that control various processes, such as photolithography processes CMP processes, etch processes, etc., may be made. This may provide for a shorter learning cycle for performing process adjustments or for selections of preferred process sets.

In one embodiment, the TDDB test results may be derived by performing a voltage ramp stress (VRS) test and measuring failure and/or a time dependent breakdown parameters. In other embodiments, the TDDB test results may be based upon a constant voltage source (CVS) test. As described in further details below, a VRS or a CVS signal may be applied as a stress signal, the results of which may be indicative of a breakdown with respect to voltage or time, respectively. Turning now to FIG. 1, a stylized statistical graph of time to breakdown, in accordance with embodiments herein, is illustrated. FIG. 1 illustrates a plurality of curves that plot probability of failure with respect to time to breakdown. A large amount of test data is generally required to generate the curves illustrated in FIG. 1. These curves may be based upon test data acquired by the testing systems described herein. In one embodiment, the slope of the curves may provide an indication of beta, e.g., beta $\beta_1$ equals to the slope at time period $t_2$–$t_1$. In one embodiment, the term "device failure" may refer to a parameter, such as a current parameter or an increase in a current parameter, exceeding a predetermined threshold. In one embodiment, the term "breakdown" may refer to a malfunction of a device due to an event such as the breakdown of a portion of the dielectric in an integrated circuit.

Test data may be used to determine the probability of failure with respect to time or voltage to breakdown. In order to perform this evaluation, data associated with a number of devices tested using a single test input is desired. Embodiments herein provide for testing a plurality of devices using a single input signal pad, as well as a single output signal pad.

Figure 2:
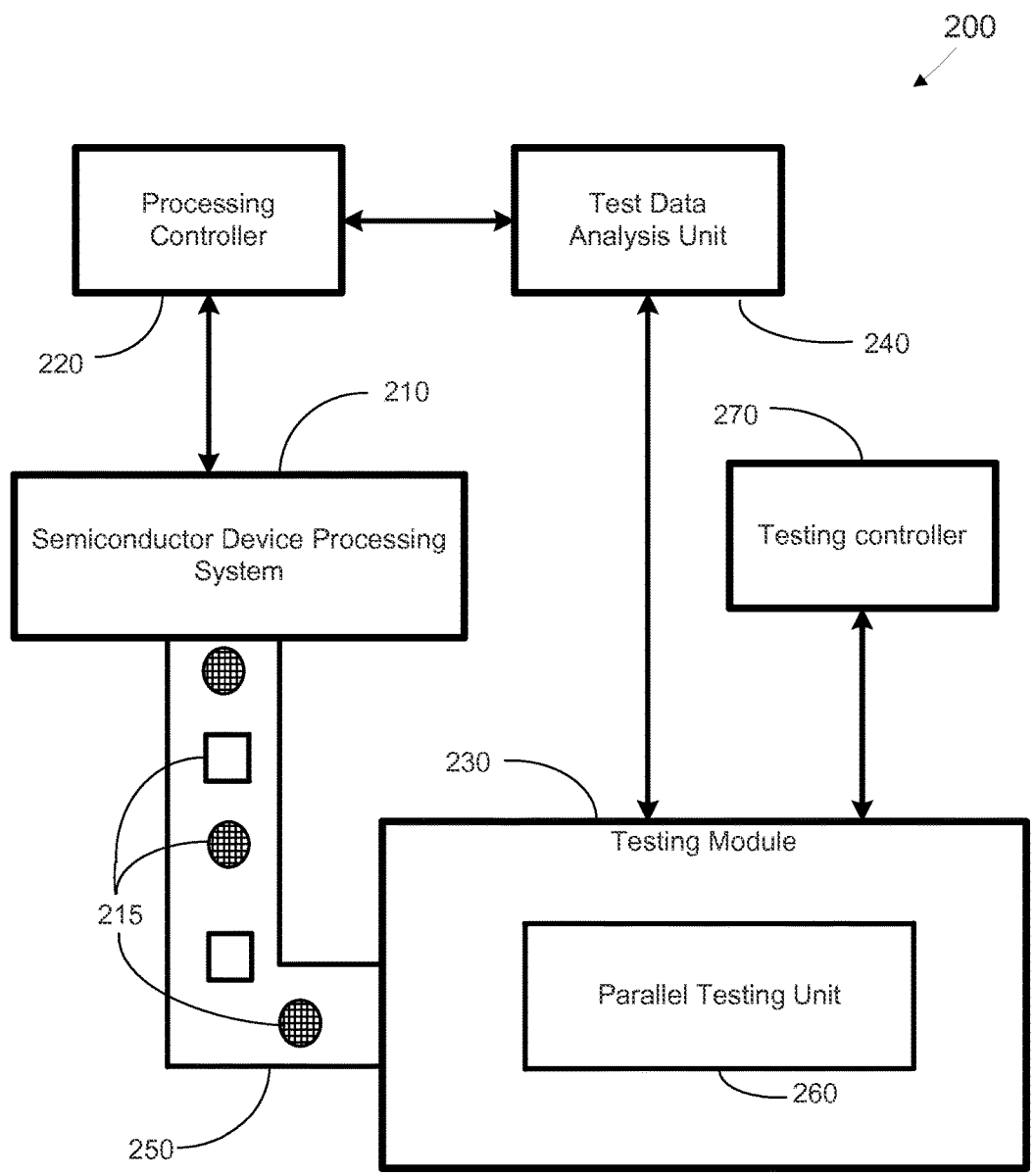
FIG. 2 illustrates a stylized block diagram depiction of a manufacturing and testing system, in accordance with some embodiments herein.

Turning now to FIG. 2, a stylized block diagram depiction of a system in accordance with some embodiments herein, is illustrated. The system 200 may comprise a semiconductor device processing system 210. The semiconductor device processing system 210 may comprise various processing stations, such as etch process stations, photolithography process stations, CMP process stations, etc. One or more of the processing steps performed by the processing system 210 may be controlled by the processing controller 220. The processing controller 220 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 210 may produce integrated circuits on a medium, such as silicon wafers. The processing system 210 may provide processed integrated circuits/devices 215 on a transport mechanism 250, such as a conveyor system. In some embodiments, the conveyor system may be sophisticated clean room transport systems that are capable of transporting semiconductor wafers. In one embodiment, the semiconductor device processing system 210 may comprise a plurality of processing sets, e.g., the $1^{st}$ process step, the $2^{nd}$ process set, etc., as described above.

In some embodiments, the items labeled "215" may represent individual wafers, and in other embodiments, the items 215 may represent a group of semiconductor wafers, e.g., a "lot" of semiconductor wafers. In some embodiments, the feedback provided by the testing module 2830 may not be on an immediate, wafer-to-wafer basis, but may be based upon a lot-to-lot basis. The testing module 230 may also be capable of determining a change from one wafer to another within a lot. In many embodiments, the testing module provides test data that may be used by the processing controller 220 to modify one or more process parameters relating to a subsequent lot of semiconductor wafers. The processed integrated circuits 215 may be provided to a testing module 230 for performing various tests. The integrated circuit/device 215 may comprise a plurality of transistors and at least one dielectric layer. In one embodiment, the dielectric layer may be comprised of silicon dioxide, silicon nitride, siliconoxynitride, or a material having a dielectric constant. The integrated circuit or device 215 may be a transistor, a capacitor, a resistor or a memory cell. In one embodiment, the device 215 is a transistor and the dielectric layer is a gate insulation layer for the transistor.

The testing module 230 may comprise a parallel test module 260. In some embodiments, the testing module 230 may perform a time-dependent voltage breakdown test to determine TDDB results. The parallel testing unit 260 is capable of detecting various failure and/or breakdown characteristics of a plurality of integrated circuit under test in a parallel fashion. In one embodiment, the parallel test module 260 is capable of providing test data relating to a breakdown of a dielectric layer of the device under test and/or at least one characteristic of a plurality of transistors of the device. A more detailed description of the parallel testing unit 260 is provided in FIG. 4 and accompanying description below.

Test data from the parallel test performed by the testing module 230 may be provided to the test data analysis unit 240. The test data analysis unit 240 may determine whether the breakdown data indicates that breakdown values are above a predetermined breakdown reference or threshold. In one embodiment, these comparisons may be made using look-up functions involving stored data in the system 200 and/or comparison with off-line data. In other embodiments, the determinations with regard to the breakdown values and the threshold shift values may be based upon manual input from external sources. Various statistical analyses may be performed, such as statistical analysis described in FIG. 1.

The testing module 230 may be controlled by the testing controller 270. Although, in one embodiment, the testing controller 270 is depicted as being external to the testing module 230, in an alternative embodiment, the testing module 270 may be within the testing module 230. The testing controller 270 may be a workstation computer, a desktop computer, a laptop computer, a tablet computer, or any other type of computing device comprising one or more software products that are capable of controlling operations of the testing module 230.

Data from the testing module is received, processed, correlated, and/or stored by the test data analysis unit 240. Data from the test data analysis unit 240 may be provided to the processing controller 220. This data may be used by the processing controller 220 to perform adjustments to subsequent processes performed by the processing system 210, and/or provide information for selecting a particular process set based upon the test data results. In this manner, a feedback process may be performed based upon the learning cycle of the liability testing performed by the testing module 230. This feedback may affect various parameters used to perform processing of integrated circuits and/or selecting particular processes for manufacturing integrated circuits. For example, data from the test data analysis unit 240 may be provided to the processing controller 220. The processing controller 220 may then use this data to adjust one or more process parameters, and/or make a selection of a processing set from a plurality of processing sets. Examples of the process parameter may include, but are not limited to, a temperature, a pressure, a duration, a process gas composition, a process gas concentration, an applied voltage of a process operation, or the like.

The system 200 may be capable of performing analysis for various products involving various technologies. For example, the system 200 may provide test data for CMOS technology, Flash technology, BiCMOS technology, power devices, memory devices (e.g., DRAM devices), NAND memory devices, power devices, and/or various other semiconductor technologies.

Figure 3:
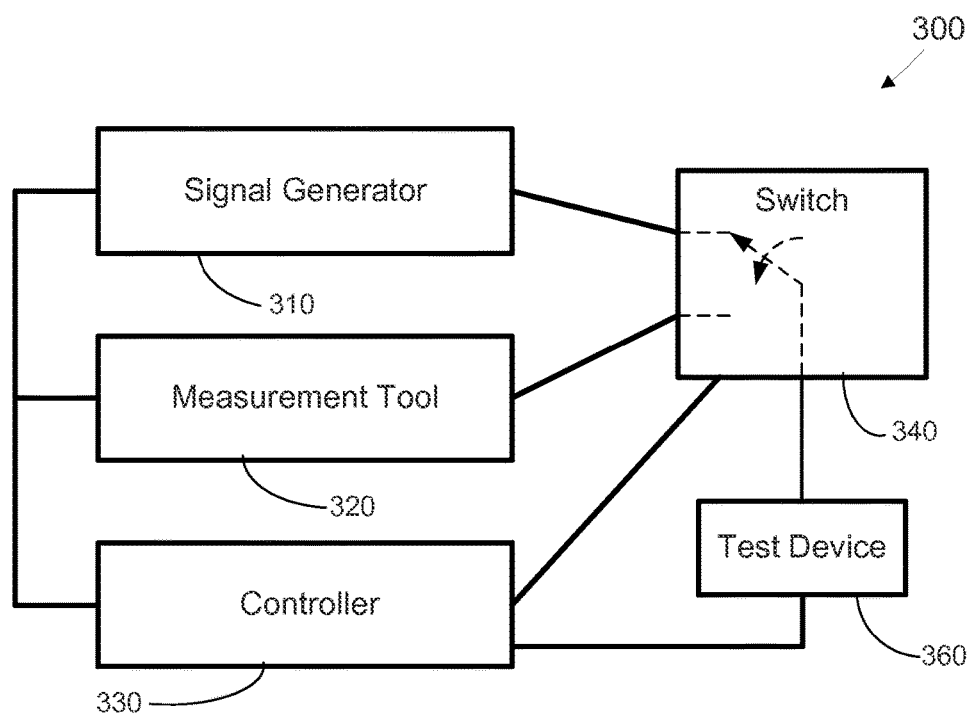
FIG. 3 illustrates an illustrative test system for evaluating the reliability of a plurality of integrated circuit devices, in accordance with embodiments herein.

FIG. 3 depicts an illustrative test system 300 that may be employed in accordance with embodiments herein for evaluating the reliability of a plurality of integrated circuit devices. In one embodiment, the test system 300 is a portion of the testing module 230. In one embodiment, the test system 300 may be the parallel test unit 260. In general, the test system 300 is comprised of a signal generator 310, a measurement tool 320 (e.g., a stress-induced current and/or a voltage measurement tool), a switch 340, and a controller 330. It should be understood that the test device 360 depicted in FIG. 3 is representative in nature of many such devices, e.g., hundreds or thousands, that may be subjected to such testing in order to acquire enough data to make reliable assessments regarding the reliability of the dielectric layers tested. Typically, the test device 360 comprises one or more test structures that are arranged for testing a plurality of integrated circuit devices in a substantially parallel manner, as described in further details below. In many cases, the tests are performed on post-production devices, however, in some cases, it may be possible to perform the testing described herein on actual production devices, although modifications may have to be made due to the complexity of the completed devices.

The signal generator 310 is capable of providing various voltage signals for performing the TDDB tests described herein. In one embodiment, the signal generator 310 may provide a voltage signal depicted in FIGS. 5 and 6 described below. That is, the signal generator 310 is capable of providing a set of ramping pulses, and/or constant voltage signals, as described below and illustrated in FIGS. 5-6.

Continuing referring to FIG. 3, in one embodiment, the signal generator 310 may be any of a variety of commercially available systems for generating such voltage signals. The magnitude of the voltage generated by the signal generator 310 may vary depending upon the application. With respect to current-day technology, wherein the operating voltage is on the order of approximately 1-2 volts, the signal generator 310 may generate signals having a voltage that ranges from approximately 4-5 volts. In some embodiment, the magnitude of the voltage pulses may be typically higher than the voltage level applied during the constant voltage TDDB testing. Moreover, the width of the pulses generated by the signal generator 310 may also vary depending upon the particular application. In some examples, the width of the pulses will be less than 1 msec. Generally, the lesser the pulse width, the better the resolution of the testing techniques described herein. In one illustrative embodiment, the signal generator 310 may be configured to generate voltage pulses that have a pulse width of approximately 100 ns. In some examples, the signal generator 310 is coupled to the gate electrode transistors under test, wherein the source and the drain terminal may be electrically coupled to ground or a reference voltage.

The measurement tool 320 may any of a variety of commercially available devices that are capable of measuring of the output voltage and/or current of a test circuit, as exemplified in FIGS. 4 and 8 below. In one particularly illustrative example, the measurement tool 320 may be used to output voltage of the test device 360 may be measured after each pulse generated by the signal generator 310. However, testing after every stress signal need not be required in all cases. For example, during the early portions of the test, when dielectric breakdown is less likely to occur, the measurement may be made less frequently, e.g., after every fourth pulse. Thereafter, as the testing continues, the gate current may be tested more frequently to investigate soft breakdown phenomenon. Thus, the present invention should not be limited to any particular testing protocol unless such limitations are clearly set forth in the appended claims.

The controller 330 depicted in FIG. 3 controls the operation of the test system 300. To that end, the controller 330 operates the switch 340 between the signal generator 310 and the measurement tool 320 as necessary depending upon the particular testing methodology and protocol selected. For example, in the case where output voltage of the test circuit is measured after every pulse, the controller 330 flips the switch 340 between the signal generator 310 and the measurement tool 320 after predetermined time periods (e.g., after a stress time period), then back again (e.g., after a sense time period) to the signal generator 310. The signal generator 310 is capable of ramping up the voltage at each pulse. The testing mechanism described above is provided for illustrative purposes, and is but one example of a testing system that may be utilized in some embodiments herein.

Figure 4:
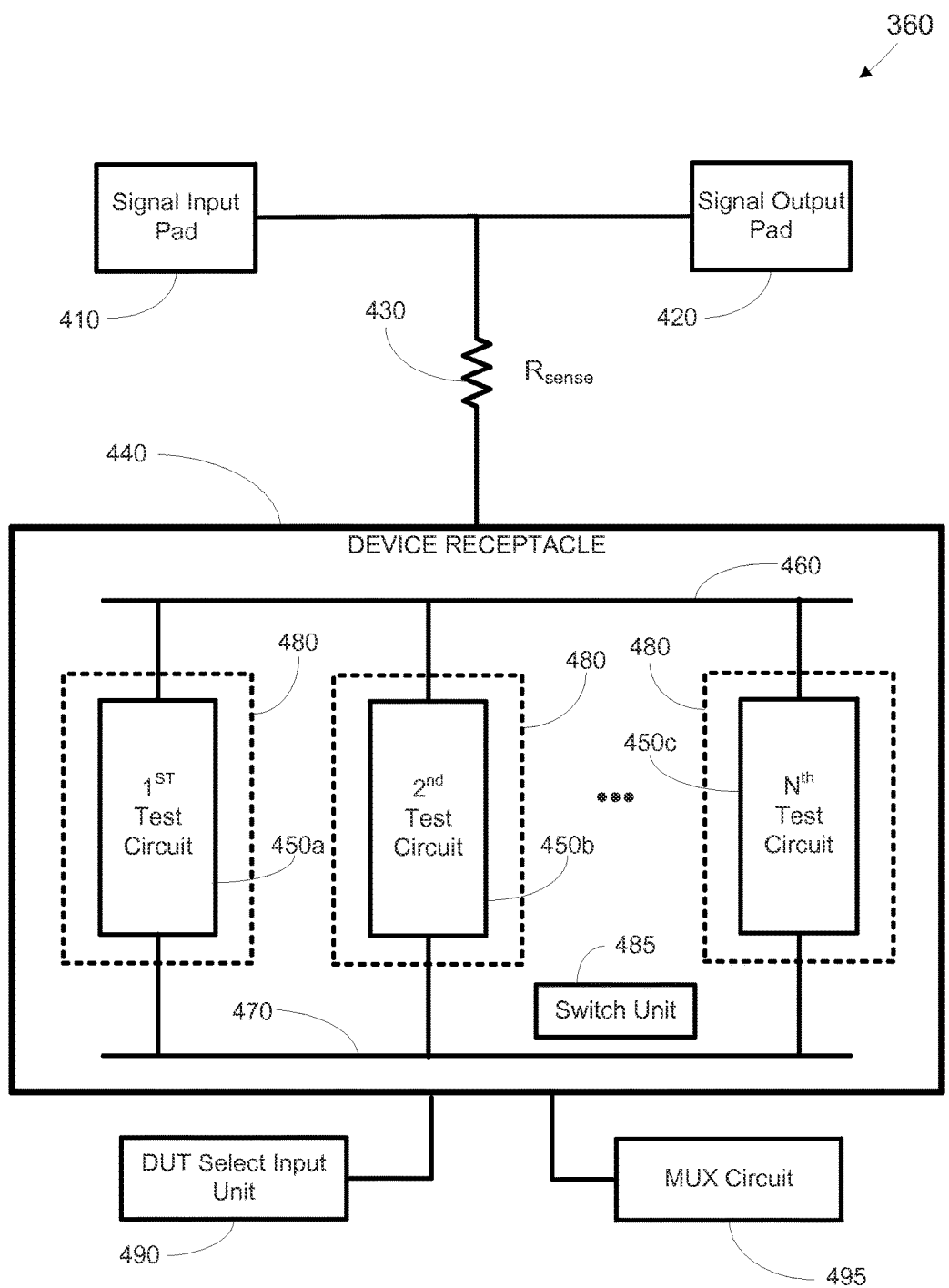
FIG. 4 illustrates a stylized block diagram depiction of the test device of FIG. 3, in accordance with embodiments herein.

Turning now to FIG. 4, a stylized block diagram depiction of the test device of FIG. 3, in accordance with embodiments herein, is illustrated. The test device 360 may be coupled to a plurality of test circuits (i.e., $1^{st}$ test circuit 450a, $2^{nd}$ test circuit 450b through $n^{th}$ test circuit 450c, collectively or generically referred to with the reference number "450") for performing TDDB testing of integrated circuit components. For example, the $1^{st}$ test circuit through $n^{th}$ test circuit 450 may comprise a circuitry that includes a device under test, e.g., a transistor, which is the subject of TDDB testing.

The test device 360 may comprise a device receptacle 440 that is capable of accommodating a plurality of test circuits 450. The device receptacle 440 may comprise a plurality of compartments 480 that are each configured to receive a test circuit ($1^{st}$ test circuit 450a) in a manner that each test circuit 450 becomes part of the overall test circuitry of the test device 360. The compartment 480 is configured such that when a test circuit 450 is coupled into the compartment 480, the test circuit 450 becomes connected to the node/wire 460 as well as to the ground or reference node 470. In this manner, a plurality of test circuits 450 may be efficiently coupled to the device receptacle 440 such that they are integrated into the overall test circuitry of the test device 360.

The test device 360 setup may provide for performing TDDB testing for a plurality of integrated circuit devices in parallel, thereby increasing the efficiency of TDDB testing and the acquisition of statistical test data. More detailed descriptions of the $1^{st}$ through $n^{th}$ test circuits 450 are provided in FIGS. 8 and 10, and accompanying descriptions below.

Continuing referring to FIG. 4, the test device 360 further comprises a signal input pad 410, a signal output pad 420, and a sense resistor ($R_{sense}$) 430 in series with the device receptacle 440. A first terminal of the resistor $R_{sense}$ 430 is coupled to the positive terminals of the signal input pad 410 and the signal output pad 420. A second terminal of the resistor $R_{sense}$ 430 is coupled to the input terminal of the device receptacle 440 such that the second terminal is coupled to the node 460. Accordingly, the resistor $R_{sense}$ 430 is positioned in series to the device receptacle 440. Those skilled in the art would appreciate that the resistor $R_{sense}$ 430 may be one of a variety of types of resistor, such as a polysilicon resistor, metal line resistor formed on a semiconductor substrate, a carbon composition resistor, a carbon pile resistor, a carbon film resistor, a thick film resistor, a thin-film resistor, a metal film resistor, an metal oxide film resistor, and/or the like.

Figure 5:
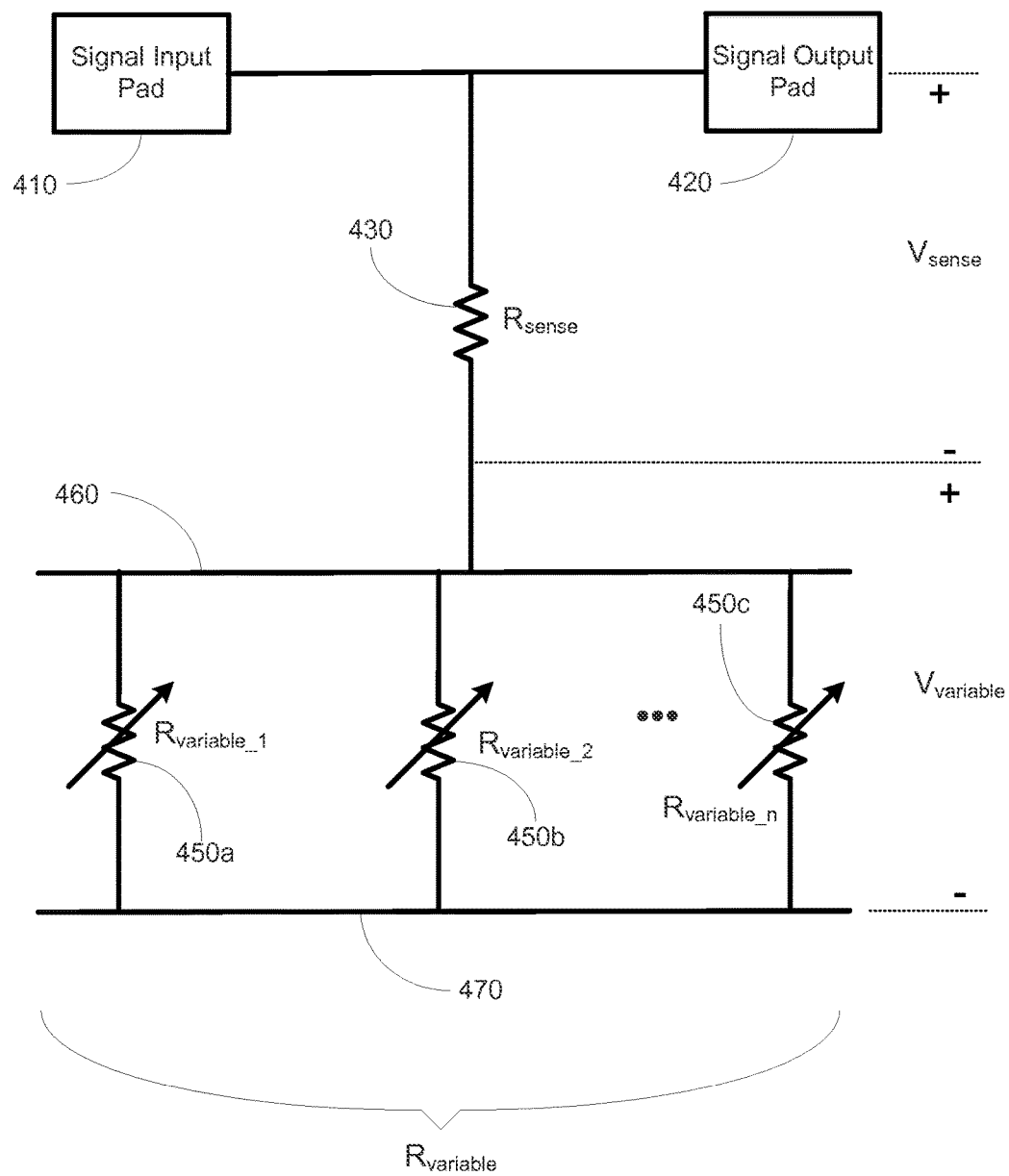
FIG. 5 illustrates an stylized alternative diagram depiction of the test device of FIG. 3, in accordance with embodiments herein.

In order to perform a TDDB test, an input stress test signal ($V_{in}$) may be applied to the signal input pad 410. A portion of the value of the $V_{in}$ may drop across the resistor $R_{sense}$ as well as the devices under test within the device receptacle 440. In one embodiment, device receptacle 440, which may comprise the $1^{st}$ through $n^{th}$ test circuits 450, may be viewed as a variable resistor ($R_{variable}$) or a number of variable resistors in parallel ($R_{variable\_1}$, $R_{variable\_2}$ through $R_{variable\_n}$), as illustrated in FIG. 5. The variable resistor ($R_{variable}$) varies according to the number of test circuits 450 that are placed in the device receptacle 440.

The voltage across the resistors $R_{sense}$ and $R_{variable}$ based on the input stress voltage ($V_{in}$) may change by a known amount when a device under test in one of the $1^{st}$ through $n^{th}$ test circuits 450 experiences a breakdown or a failure during a TDDB test. This change in voltage may be detected on the signal output pad 420 (i.e., $V_{out}$). In one embodiment, the output pad 420 may be configured to sense the voltage across the sense resistor $R_{sense}$ (i.e., $V_{sense}$). In an alternative embodiment, the output pad 420 may be configured to sense the voltage across the variable resistor $R_{variable}$ (i.e., $V_{variable}$). That is, in one embodiment, the output voltage $V_{out}$ is equal to $V_{sense}$, while in another embodiment, the output voltage is equal to $V_{variable}$.

Figure 6:
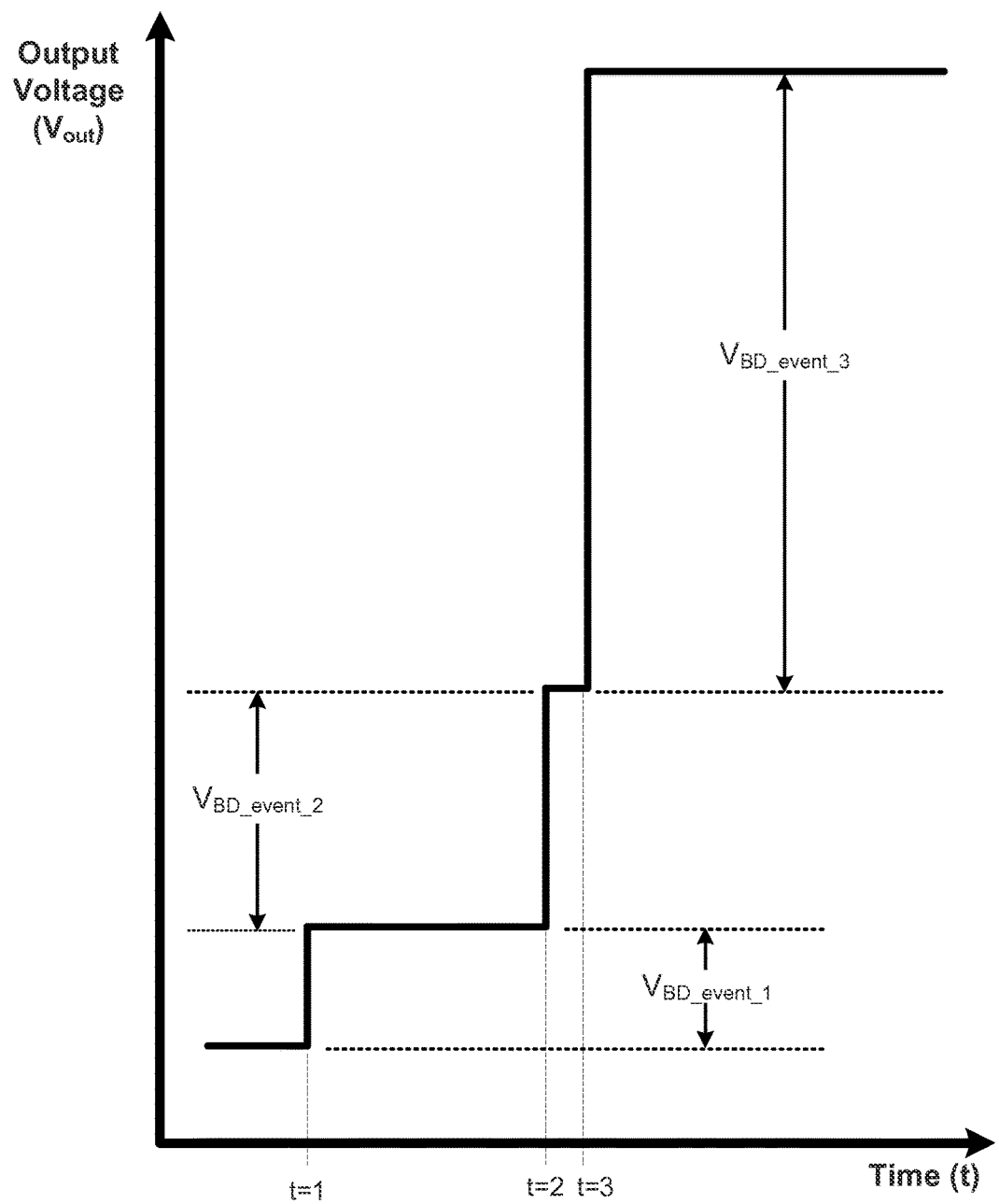
FIG. 6 illustrates an exemplary output signal provided by the test device of FIG. 3, in accordance with embodiments herein.

FIG. 6 illustrates an exemplary output signal ($V_{out}$) that may appear on the signal output pad 420. In response to the input signal applied to the signal input pad 410, as breakdowns of the devices under test in the $1^{st}$ through $n^{th}$ test circuits 450 occur, the value of the output signal $V_{out}$ (i.e., $V_{sense}$ or $V_{variable}$) changes by a predetermined amount. That is, for each breakdown at a particular time, the output voltage $V_{out}$ may change proportionally to the number of test devices that experienced a breakdown. For example, when a breakdown or a failure of the device under test in the $1^{st}$ test circuit 450a occurs at time t=1 (FIG. 6), the value of the output signal $V_{out}$ changes by the amount $V_{BD\_event\_1}$. This can viewed as if the variable resistor $R_{variable\_1}$ stopped conducting and the voltage drop that would've occurred but for the failure or breakdown of the DUT in the first circuit 450a is no longer present, thus the output voltage $V_{out}$ rises proportionally (by the amount of $V_{BD\_event\_1}$). Therefore, each rise in the output voltage by the amount $V_{BD\_event\_1}$ may correspond to a breakdown event in one of the devices under test in one of the $1^{st}$ through $n^{th}$ test circuits 450.

Accordingly, if several DUTs experience breakdowns or failure events at a particular time, the output voltage $V_{out}$ may change proportionally to that number of DUTs. For example, at time t=2, if two DUTs breakdown, the output voltage $V_{out}$ may change by a larger amount (by the amount of $V_{BD\_event\_2}$) as compared to $V_{BD\_event\_1}$. Similarly, in another example, in the event that five DUTs breakdown at time t=3, the output voltage $V_{out}$ may change by an even larger amount (by the amount of $V_{BD\_event\_3}$).

In some embodiments, the change in the output signal $V_{out}$ by the amount $V_{BD\_event\_(1-n)}$ may be attributed to the failure or breakdown of one or more particular DUT in one of the $1^{st}$ through $n^{th}$ test circuits 450. This attribution may be performed by selecting one of the $1^{st}$ through $n^{th}$ test circuits 450 for analysis. Referring back to FIG. 4, in an alternative embodiment, the test device 360 may further comprise a DUT select input unit 490 and a MUX circuit 495. The DUT select input unit 490 may be configured to select one of the $1^{st}$ through $n^{th}$ test circuits 450 for analysis (for stress and/or for sense functions). Further, in this alternative embodiment, the device receptacle 440 may comprise a switch unit 485, which may comprise a plurality of switches that may be activated or deactivated in order to select one or more of the $1^{st}$ through $n^{th}$ test circuits 450 for analysis. The MUX circuit 495 is capable of selecting the appropriate sense result. More detailed descriptions of the DUT select unit 490 and the MUX circuit 495 are provided in FIG. 7 and accompanying descriptions below.

Figure 7:
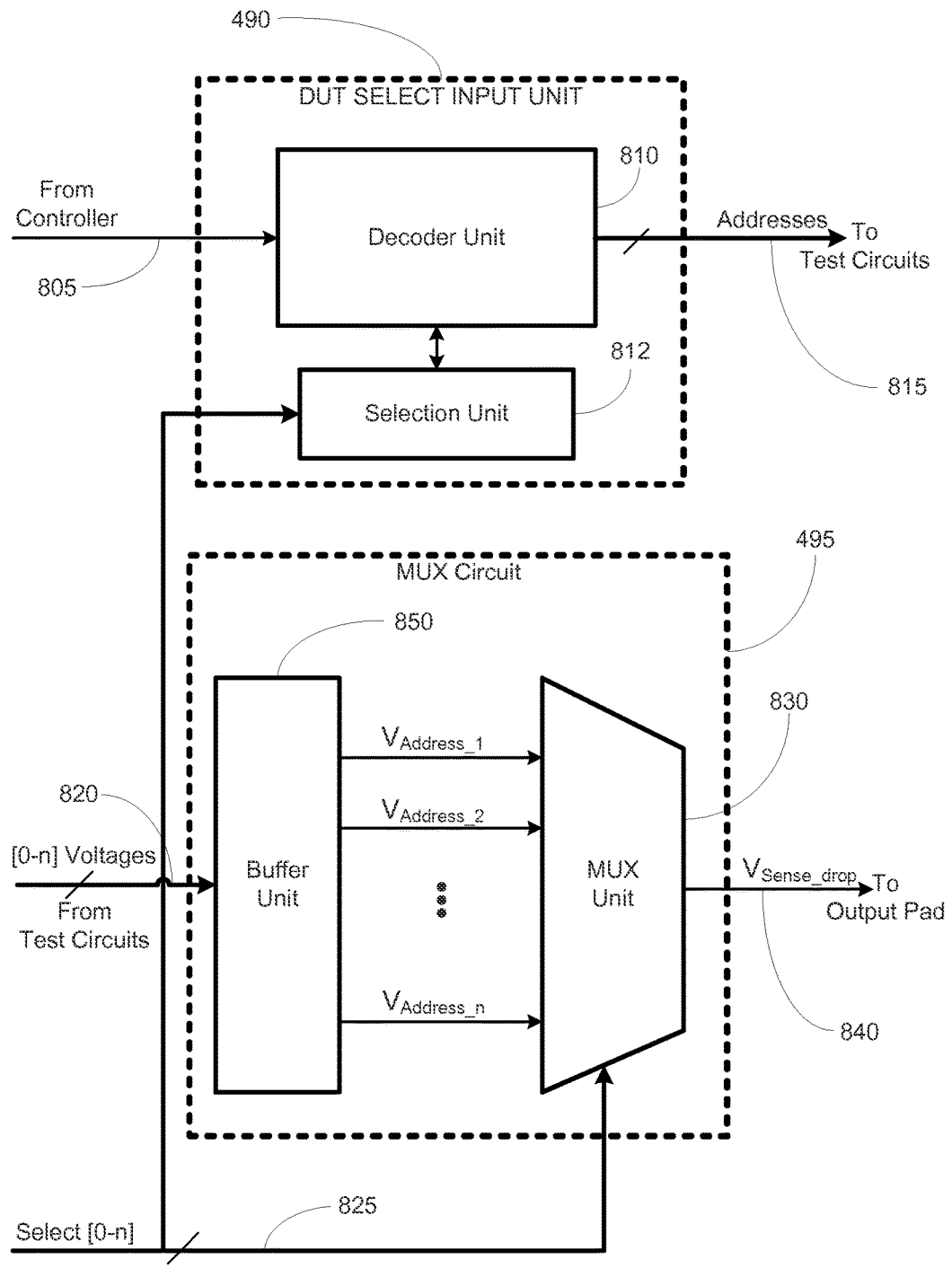
FIG. 7 illustrates a stylized block diagram depiction of the DUT select unit and the MUX circuit of FIG. 4, in accordance with some embodiments herein.

Turning now to FIG. 7, a stylized block diagram depiction of the DUT select input unit 490 and the MUX circuit of FIG. 4, in accordance with some embodiments herein is illustrated. The DUT select input unit 490 may comprise a decoder unit 810 and a selection unit 812. The MUX circuit 495 may include a buffer unit 850, and a multiplexer (MUX) unit 830.

In one embodiment, the controller 360 (FIG. 3) may provide one or more signals (line 805) to the decoder input unit 810 for selecting one or more specific DUTs in the $1^{st}$ through $n^{th}$ test circuits 450 to receive a stress input or a sense input. Based upon the signal 805 from the controller 330, and a selection signal, Select[0-n], the decoder unit 810 and the selection unit 812 may be configured to generate one or more addresses (line 815) for selecting one or more of the $1^{st}$ through $n^{th}$ test circuits 450 for analysis. In one embodiment, the address signal 815 may be provided to the switch unit 485 (FIG. 4) for selecting one or more DUTs for either stress or for sense functions.

The MUX circuit 495 may receive one or more voltage output signals based upon the selected test circuit 450. In one embodiment, there may be up to "n" number of output voltage signals (i.e., $V_{Address\_1}$ through $V_{Address\_n}$) for each of the $1^{st}$ through $n^{th}$ addresses that represent each DUT respectively associated with the $1^{st}$ through $n^{th}$ test circuits 450. In one embodiment, the output signals $V_{Address\_1}$ through $V_{Address\_n}$ may be held in the buffer unit 850. The Select(0-n) signal 825 may select one or more output signals $V_{Address\_1}$ through $V_{Address\_n}$ from the buffer unit 850 to pass through the multiplexer unit 830. The multiplexer unit 830 may comprise one or more multiplexers. The select(0-n) signal 825 may select one or more output signals $V_{Address\_1}$ through $V_{Address\_n}$ and provide them to the output pad 420. This may be performed using the switch unit 485. The output signal from the multiplexer unit 830 ($V_{sense\_drop}$) unit may present the voltage drop experienced by the sense resistor $R_{sense}$ and the device receptacle 440 (i.e., the variable resistor $R_{variable}$) based upon the selected DUT. In this manner, the time to breakdown or failure of any of the selected DUT in the $1^{st}$ through $n^{th}$ test circuits 450 may be determined.

Figure 8:
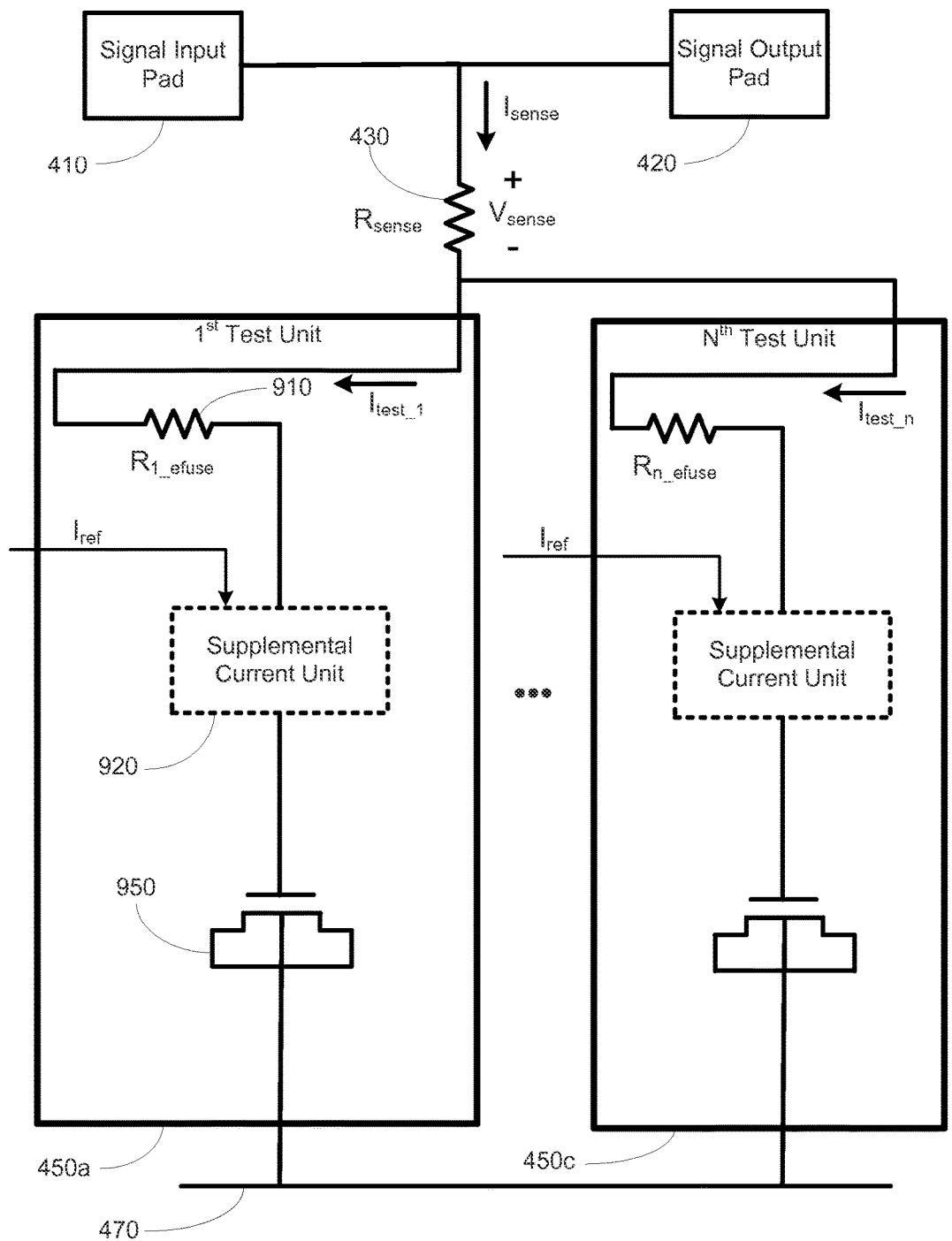
FIG. 8 illustrates a stylized depiction of the test circuits of FIG. 4, in accordance with embodiments herein.

Turning now to FIG. 8, a stylized depiction of the $1^{st}$ through $n^{th}$ test circuits 450 (FIG. 4), in accordance with embodiments herein is illustrated. In one embodiment, the $1^{st}$ test circuit 450a may comprise a resistor ($R_{1\_efuse}$) and a device under test 950, such as a transistor. In one embodiment, the DUT (transistor 950) may be configured such that the source and the drain terminal may be electrically shorted to the ground or reference node 470. The DUT 950 may be subjected to various tests, such as a TDDB test. Results from the TDDB, i.e., the time to breakdown, may be recorded. Based upon test data for a plurality of test circuits, a significant amount statistical test data may be acquired in a substantially short time period.

In one embodiment, the resistor $R_{1\_efuse}$ 910 may be configured serially in relation to the transistor 950. In an alternative embodiment, a supplemental current unit 920 may be positioned in serial with respect to the resistor $R_{1\_efuse}$ 910 and the transistor 950, as indicated by the dotted-lined block 920 in FIG. 7. In some embodiments, the transistor 950 may behave as a capacitor. A more detailed description of the supplemental current unit 920 is provided in FIGS. 11 and 12, and accompanying description below.

Continuing referring to FIG. 7, the resistor $R_{1\_efuse}$ 910 may be an efuse resistor, which may be variety of types of resistors that substantially terminate electrical connection if it experiences a predetermined amount of current. The $2^{nd}$ through $n^{th}$ test circuits 450 may be similar to the $1^{st}$ test circuit 450a and their respective efuse resistors may be denoted $R_{2\_efuse}$ through $R_{2\_efuse}$. In alternative embodiment, the resistor $R_{1\_efuse}$ 910 may be replaced with one of a variety of types of fuses known to those skilled in the art, wherein the fuses are configured to substantially stop current flow when the current through it exceeds a predetermined current value.

Each of the test circuits 450 are arranged in parallel, therefore, the current ($I_{sense}$) that travels through the sense resistor $R_{sense}$ is divided substantially equally throughout the test circuits 450. As indicated in FIG. 8, each of the efuse resistors ($R_{1\_efuse}$, $R_{2\_efuse}$ through $R_{n\_efuse}$) experiences respective efuse currents ($I_{test\_1}$, $I_{test\_2}$ through $I_{test\_n}$, generically referred to as $I_{test}$). Therefore, the relationship between the sense current and the efuse currents can be defined by Equation 1.

$$I_{sense} = I_{test\_1} + I_{test\_2} + I_{test\_3} \cdots + I_{test\_n} \qquad \text{Eq. 1}$$

Further, the voltage ($V_{sense}$) across the sense resistor $R_{sense}$ is defined by Equations 2 and 3.

$$V_{sense} = I_{sense} * R_{sense}; \qquad \text{Eq. 2}$$

which is also equivalent to:

$$V_{sense} = (I_{test\_1} + I_{test\_2} + I_{test\_3} \cdots + I_{test\_n}) * R_{sense} \qquad \text{Eq. 3}$$

Accordingly, as indicated by Equation 3, if any one of the efuse test currents ($I_{test\_1}$, $I_{test\_2}$ through $I_{test\_n}$) changes, the sense voltage ($V_{sense}$) across the sense resistor $R_{sense}$ would also change by a proportional amount. In one embodiment, upon breakdown of the DUT (e.g., transistor 950), or upon an excessive current passing through the efuse resistor ($R_{1\_efuse}$, $R_{2\_efuse}$, and/or $R_{n\_efuse}$), which would cause the efuse resistor 910 to substantially terminate current flow, the sense voltage ($V_{sense}$), or alternatively, the variable voltage ($V_{variable}$), would change proportionally. This voltage would appear on the signal output pad 420 ($V_{out}$). Therefore, by monitoring the signal ($V_{out}$) on the signal output pad 420, a breakdown or failure of a DUT (e.g., transistor 950) in one of the test circuits 450 may be detected.

In some cases, after the DUT (e.g., transistor 950) experiences a failure or breakdown, the current passing through the efuse resistor 910 may be different compared to a reference current; however, the higher current may not be sufficient to cause the efuse resistor 910 to "blow," or stop conducting. In this case, a determination may be made to disable the test circuit 450 that contains the DUT (e.g., transistor 950) that experienced the breakdown or failure. This may be performed by causing the efuse resistor ($R_{1\_efuse}$, $R_{2\_efuse}$, or $R_{n\_efuse}$) 910 to "blow" (i.e., substantially stop electrical current flow). The termination of electrical current flow by an efuse resistor 910 may be actively prompted by the supplemental current unit 920. The supplemental current unit 920 may be capable of providing a current that is sufficiently high to be able to blow the efuse resistor 910.

Figure 9:
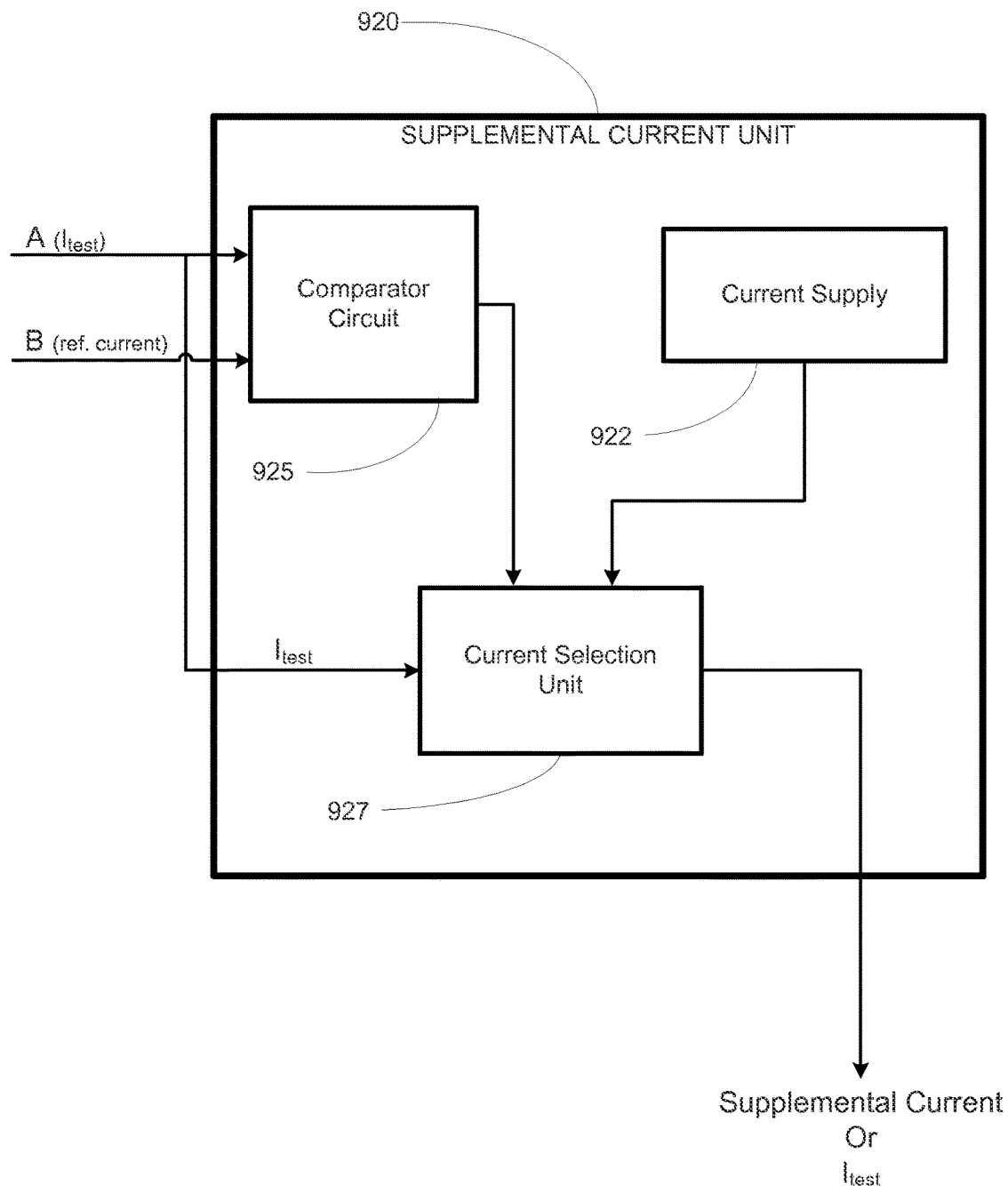
FIG. 9 illustrates a stylized block diagram depiction of a supplemental current unit, in accordance with embodiments herein.

Turning now to FIG. 9, a stylized block diagram depiction of the supplemental current unit 920, in accordance with embodiments herein, is illustrated. The supplemental current unit 920 may comprise a comparator circuit 925, a current supply 922, and a current selection unit 927. The output of the supplemental current unit 920 is a supplemental current that is sufficient to blow the efuse resistor 910.

Based upon a comparison result of input nodes A and B of the comparator circuit 922, the current selection unit 927 may either maintain the existing current, or replace the existing current by a higher, supplemental current. That is, if the comparator circuit 925 indicates that the current (e.g., input "A") flowing through the efuse resistor 910 is below a predetermined reference current (e.g., input "B"), the supplemental current unit 920 may provide the normal efuse test current ($I_{test\_1}$, $I_{test\_2}$ through $I_{test\_n}$). However, if the comparator circuit 925 indicates that the current flowing through the efuse resistor 910 is equal or larger that the predetermined reference current, the supplemental current unit 920 may provide the larger current provided by the current supply 922. This larger, supplemental current is predetermined to be of such value that this current would cause the efuse resistor 910 to seize conducting and substantially stop the flow any current. This effectively terminates the test circuit 450 from the overall testing circuitry in the test device 360.

Figure 10:
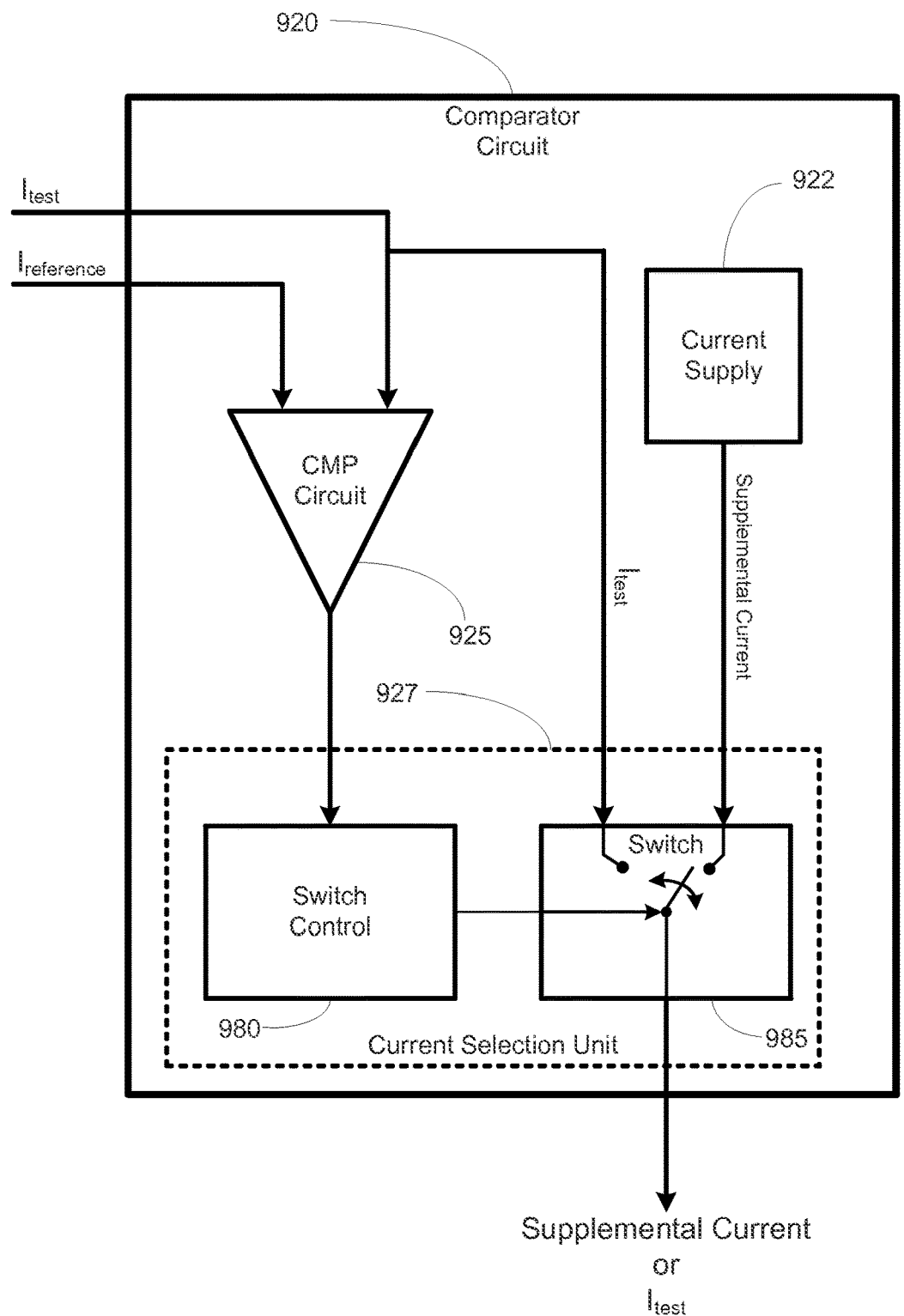
FIG. 10 illustrates a stylized block diagram a more detailed block diagram depiction of the supplemental current unit of FIG. 8, in accordance with embodiments herein.

Turning now to FIG. 10, a more detailed block diagram depiction of the supplemental current unit 920 of FIG. 9, in accordance with embodiments herein, is illustrated. The comparator circuit 925 may compare a predetermined reference current (node A) to the efuse test current $I_{test}$. In one embodiment, the predetermined reference current may be of a value that is similar to the efuse current $I_{test}$ during normal testing of the DUT (e.g., transistor 950). In the event that the efuse test current $I_{test}$ is found to be greater than the reference current, this event may be interpreted as a failure or breakdown of the DUT 950. However, in some cases, the efuse test current $I_{test}$ may not be sufficient to blow the efuse resistor 910 despite being unusually higher as a result of a failure or breakdown of the DUT 950. In this case, the comparator circuit 925 may send a control signal to the current selection unit 927. This may prompt an action by the current selection unit 927, which may cause the switch control 980 to control the switch 985 such that a higher current from the current supply 922 is provided. Accordingly, the supplemental current unit 920 is capable of switching between the normal efuse test current and a higher supplemental current. This higher current (i.e., supplemental current) may be sufficient to blow the efuse resistor 910, effectively eliminating the associated test circuit 450 from the overall testing circuitry. This would cause the output voltage $V_{out}$ to change proportionally, which may indicate that a DUT 950 has failed and/or has experienced a breakdown. Those skilled in the art would appreciate that a variety of type of integrated circuit devices may be tested in the test circuit 450 described above and remain within the spirit and scope of embodiments herein.

Utilizing embodiments provided herein, local variability may be measured. Further, using a single touch down, substantially large test data statistics may be achieved with regard to various areas of integrated circuit devices, as well as with regard to various test voltages. The tests described herein may be performed in a process inline fashion using VRS and or CVS test signals. Embodiments herein provide for a more efficient and faster learning cycle for TDDB testing. Embodiments provided herein may be performed on various technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:
1. A method, comprising:
providing a first device and a second device for testing;
providing a test signal for performing a time-dependent dielectric breakdown (TDDB) test on said first and second devices;
providing a selection signal for selecting said first and second devices for performing said TDDB test;
arranging said first and second devices in series with a first resistor such that, based upon said selecting, said test signal is applied substantially simultaneously to said first and second devices through said first resistor; and determining whether at least one of a breakdown or a failure of at least one of said first and second devices has occurred based upon a change in voltage across said first resistor.

2. The method of claim 1, further comprising determining a time period defined by a first mark indicating providing said test signal and a second mark indicating the detection of at least one of a failure or breakdown of at least one of said first and second devices.

3. The method of claim 1 further comprising determining a statistical profile of a time to breakdown or failure indication of said first and second devices.

4. The method of claim 1, wherein providing said test signal comprises providing at least one of a voltage ramp signal or a constant voltage signal.

5. The method of claim 1, wherein said first and second devices are comprised of at least one of a transistor, a capacitor, a resistor, memory cell, a CMOS device, a BiCMOS device, a Flash device, a DRAM memory device, a NAND memory device, or a power device.

6. The method of claim 1, wherein said device is a transistor.

7. The method of claim 1, wherein arranging said first and second devices in series with a first resistor comprises providing a device receptacle in series to said first resistor, wherein said device receptacle is configured to accept said first and second devices for testing.

8. The method of claim 7, further comprising providing a first fuse in series to said first device and a second fuse in series to said second device, wherein said first and second fuses are configured to substantially terminate flow of electrical current in response to the current traveling through said second and third resistors exceed a first predetermined current level.

9. The method of claim 8, further comprising a supplemental current unit to provide a supplemental current to substantially terminate flow of electrical current through said first and second fuses in response to a determination that the current through a comparator exceeds a second predetermined current level.

10. The method of claim 1, wherein performing said TDDB test comprises performing said TDDB test in a predetermined temperature.

11. The method of claim 1, further comprising modifying at least one process parameter based upon said TDDB test.

12. The method of claim 9, modifying said at least one process parameter wherein comprises modifying at least one of a temperature, a pressure, a duration, a process gas composition, a process gas concentration, and an applied voltage of a process operation.

13. A system, comprising:
a semiconductor device processing system to provide a device for testing;
a processing controller operatively coupled to said semiconductor device processing system, said processing controller configured to control an operation of said semiconductor device processing system; and
a testing module for providing a test signal for performing a time-dependent dielectric breakdown (TDDB) test on a first device and a second device substantially simultaneously, wherein said testing module comprises:
a first resistor comprising a first node and a second node, said first node being coupled to the positive node of said test signal; and
a test device receptacle electrically coupled in series to said second node of said first resistor, wherein said test device comprising a first portion in which said first device is electrically coupled in series with a first fuse, and a second portion in which said second device is electrically coupled in series with a second fuse; and
wherein said testing module is configured to determine whether at least one of a breakdown or a failure of at least one of said first and second devices has occurred based upon a change in voltage across said first resistor.

14. The system of claim 13, wherein said processing controller is configured to modify at least one process parameter based upon said data relating to at least one of said failure or breakdown.

15. The system of claim 13, further comprising:
a testing controller operatively coupled to said testing module, said testing controller configured to control an operation of said testing module; and
a test data analysis unit to perform an analysis of said data relating to at least one of said breakdown or failure, said test data analysis unit to provide analysis data to said processing controller for modifying at least one process parameter.

16. The system of claim 13, wherein said testing device further comprising a device under test (DUT) selection unit configured to select one or more of said first and second devices for testing.

17. An apparatus, comprising:
a testing module for providing a test signal for performing a time-dependent dielectric breakdown (TDDB) test on a first device and a second device substantially simultaneously, wherein said testing module comprises:
a first resistor comprising a first node and a second node, said first node being coupled to the positive node of said test signal;
a test device receptacle electrically coupled in series to said second node of said first resistor, wherein said test device comprising a first test circuit to which said first device is electrically coupled, and a second test circuit in which said second device is electrically coupled; and
a selection circuit configured to select at least one of said first and second test circuits for at least one of stressing or sensing for performing said TDDB test; and
wherein said testing module is configured to determine whether at least one of a breakdown or a failure of at least one of said first and second devices has occurred based upon a change in voltage across said first resistor.

18. The apparatus of claim 17, wherein said first test circuit comprises a first efuse resistor and the second test circuit comprises a second efuse resistor, wherein said first efuse resistor is capable of substantially terminating electrical current flow in response to said first device experiencing said at least one of failure or breakdown, and wherein said second efuse resistor is capable of substantially terminating electrical current flow in response to said second device experiencing said at least one of failure or breakdown.

19. The apparatus of claim 18, wherein said first test circuit comprises a first supplemental current unit configured to provide a current to cause said first efuse resistor to seize conducting to proportionally change the voltage value across said first resistor, and wherein said second test circuit comprises a second supplemental current unit to provide a current to cause said second efuse resistor to seize conducting to proportionally change the voltage value across said first resistor.

20. The apparatus of claim 19, wherein said first supplemental current unit comprises:
   a comparator to compare a current through said efuse resistor to a reference current, wherein said comparator to assert a comparison signal indicating that said current through said first efuse resistor exceeds said reference current; and
   a current selection unit to select said supplemental current in response the assertion of said comparison signal.

* * * * *